United States Patent [19]
Gardner et al.

[11] Patent Number: 5,811,347
[45] Date of Patent: Sep. 22, 1998

[54] NITROGENATED TRENCH LINER FOR IMPROVED SHALLOW TRENCH ISOLATION

[75] Inventors: Mark I. Gardner, Cedar Creek; Fred N. Hause, Austin, both of Tex.; Kuang-Yeh Chang, Los Gatos, Calif.

[73] Assignee: Advanced Micro Devices, Inc.

[21] Appl. No.: 641,028

[22] Filed: Apr. 29, 1996

[51] Int. Cl.$^6$ .................................................. H01L 21/76
[52] U.S. Cl. .................. 438/435; 438/424; 438/788; 438/296; 198/DIG. 50
[58] Field of Search ................................... 438/424, 435, 438/296, 221, 788; 148/DIG. 50

[56] References Cited

U.S. PATENT DOCUMENTS

| | | |
|---|---|---|
| 4,986,879 | 1/1991 | Lee . |
| 5,372,950 | 12/1994 | Kim et al. . |
| 5,387,540 | 2/1995 | Poon et al. .............................. 438/433 |
| 5,399,520 | 3/1995 | Jang ................... 148/DIG. 50 |
| 5,447,884 | 9/1995 | Fahey et al. ........................... 438/437 |
| 5,492,858 | 2/1996 | Bose et al. . |

OTHER PUBLICATIONS

Severi, M. et al., "Process Dependence of Hole Trapping in Thin Nitrided SiO$_2$ Films," IEEE Transactions on Electron Devices, vol. 36, No. 11, Nov. 1, 1989, pp. 2447–2451.
International Search Report for PCT/US 97/02493 mailed May 28, 1997.

Wolf, Stanley, Ph.D., *Silicon Processing for the VLSI Era, vol. 3: The Submicron Mosfet,* 1995 by Lattice Press, pp. 555–568.

*Primary Examiner*—Trung Dang
*Attorney, Agent, or Firm*—Kevin L. Daffer; Conley, Rose & Tayon

[57] ABSTRACT

A method of forming an improved isolation trench between active regions within the semiconductor substrate. The improved method incorporates a trench liner having a nitrogen content of approximately 0.5 to 2.0 percent. A pad layer is formed on a silicon substrate and a nitride layer is formed on the pad layer. Thereafter, a photoresist layer is patterned on the silicon nitride layer such that regions of the nitride layer are exposed where an isolation trench will subsequently be formed. Next, the exposed regions of the nitride layer and the pad layer situated below the exposed regions of the nitride layer are etched away to expose regions of the silicon substrate. Subsequently, isolation trenches are etched into the silicon substrate with a dry etch process. A trench liner is then formed and nitrogen incorporated into the trench liner. Incorporation of nitrogen into the trench liner can be accomplished by either forming the trench liner in the presence of a nitrogen bearing ambient or by forming a pure SiO$_2$ trench liner and subsequently implanting the SiO$_2$ trench liner with nitrogen. After formation of the nitrogenated trench liner, the trench is filled with a dielectric preferably comprised of a CVD oxide. Thereafter, the CVD fill dielectric is planarized and the nitride layer is stripped away.

13 Claims, 2 Drawing Sheets

NITROGENATED TRENCH LINER FOR IMPROVED SHALLOW TRENCH ISOLATION

BACKGROUND OF THE INVENTION

1. Field of the Invention

This invention relates to semiconductor fabrication and more particularly to an improved shallow trench isolation structure incorporating a nitrogenated trench liner.

2. Description of the Relevant Art

The fabrication of an integrated circuit involves placing numerous devices in a single semiconductor substrate. Select devices are interconnected by a conductor which extends over a dielectric which separates or "isolates" those devices. Implementing an electrical path across a monolithic integrated circuit thereby involves selectively connecting isolated devices. When fabricating integrated circuits it must therefore be possible to isolate devices built into the substrate from one another. From this perspective, isolation technology is one of the critical aspects of fabricating a functional integrated circuit.

A popular isolation technology used for an MOS integrated circuit involves the process of locally oxidizing silicon. Local oxidation of silicon, or LOCOS process involves oxidizing field regions between devices. The oxide grown in field regions is termed field oxide, wherein field oxide is grown during the initial stages of integrated circuit fabrication, before source and drain implants are placed in device areas or active areas. By growing a thick field oxide in field regions pre-implanted with a channel-stop dopant, LOCOS processing serves to prevent the establishment of parasitic channels in the field regions.

While LOCOS has remained a popular isolation technology, there are several problems inherent with LOCOS. First, a growing field oxide extends laterally as a bird's-beak structure. In many instances, the bird's-beak structure can unacceptably encroach into the device active area. Second, the pre-implanted channel-stop dopant oftentimes redistributes during the high temperatures associated with field oxide growth. Redistribution of channel-stop dopant primarily affects the active area periphery causing problems known as narrow-width effects. Third, the thickness of field oxide causes large elevational disparities across the semiconductor topography between field and active regions. Topological disparities cause planarity problems which become severe as circuit critical dimensions shrink. Lastly, thermal oxide growth is significantly thinner in small field (i.e., field areas of small lateral dimension) regions relative to large field regions. In small field regions, a phenomenon known as field-oxide-thinning effect therefore occurs. Field-oxide-thinning produces problems with respect to field threshold voltages, interconnect-to-substrate capacitance, and field-edge leakage in small field regions between closely spaced active areas.

Many of the problems associated with LOCOS technology are alleviated by an isolation technique known as the "shallow trench process". Despite advances made to decrease bird's-beak, channel-stop encroachment and non-planarity, it appears that LOCOS technology is still inadequate for deep sub-micron MOS technologies. The shallow trench process is better suited for isolating densely spaced active devices having field regions less than one micron in lateral dimension.

The trench process involves the steps of etching a silicon substrate surface to a relatively shallow depth, e.g., between 0.05 to 0.5 microns, and then refilling the shallow trench with a deposited dielectric. Some trench processes include an interim step of growing oxide on trench walls prior to the trench being filled with a deposited dielectric. After the trench is filled, it is then planarized to complete the isolation structure.

The trench process eliminates bird's-beak and channel-stop dopant redistribution problems. In addition, the isolation structure is fully recessed, offering at least a potential for a planar surface. Still further, field-oxide thinning in narrow isolation spaces does not occur and the threshold voltage is constant as a function of channel width.

Despite its many advantages over LOCOS, the conventional trench isolation process described above is not without its own set of drawbacks.

The plasma etch process used to form the trench in the silicon substrate is believed to leave behind a silicon surface in which a plurality of dangling bonds are present. These dangling bonds can contribute to leakage current and can otherwise reduce the reliability of the isolation structure. Rapid thermal processing, while able to repair some of the damage caused by the plasma etch, cannot completely reverse the effects of the silicon plasma etch.

In addition, diffusion of unwanted species into the isolation dielectric can occur in conventional trench isolation structures. Boron, for example, is a fast diffuser that is believed to diffuse into the isolation dielectric of the field oxide used in LOCOS processes and into the isolation dielectric used in conventional shallow trench isolation or STI processes. In addition, it is believed that the dielectric in a conventional trench isolation structure and the silicon sidewall of the trench form with a rather weak bond strength. Weak bond strength can contribute to increased leakage current and degrade the reliability of the isolation structure.

Another problem associated with conventional trench isolation is the consumption of the silicon active region during the thermal oxidation step. In many STI processes, a thin thermal oxide is grown on the edge of the silicon sidewalls and floor of the isolation trench prior to filling the trench with a CVD dielectric. While it is desirable to incorporate this thermal oxide into the isolation structure, the thermal oxidation process consumes silicon at the edges of the active areas. Excessive consumption of device active areas during the thermal oxidation process can degrade device performance, increase subthreshold leakage, and limit the density at which devices may be designed within the circuit thus resulting in undesirably large die sizes.

It would therefore be desirable to modify the conventional STI process to address the problems mentioned above. Specifically, it is desirable to design a trench isolation process that results in an increased bond strength between the trench dielectric and the silicon sidewalls, reduces the potential for sodium and boron diffusion, reduces subthreshold leakage currents, and consumes little of the silicon active area during thermal oxidation.

SUMMARY OF THE INVENTION

The problems outlined above are in large part addressed by an improved STI process of the present invention. The STI process hereof incorporates a nitrogen bearing species into the trench dielectric. The nitrogen species can be introduced into the trench dielectric through a variety of steps including forming a thermal oxide in a nitrogen containing ambient, forming an oxide prior to a rapid thermal processing step performed in a nitrogen bearing ambient, or implanting a nitrogen bearing species into a grown or deposited oxide. When present in the appropriate proportion, the nitrogen containing dielectric forms a stronger bond with the silicon sidewalls of the trench than trench dielectrics formed in the absence of nitrogen. The increased bond strength is believed to reduce leakage currents and increase the reliability of the isolation dielectric. In addition, the nitrogen bearing dielectric provides a reliable barrier to impurity diffusion. Still further, the incorporation of nitrogen is believed to result in an inherently limited thermal oxidation process. In other words, the incorporation of nitrogen results in a thermal oxidation process that is inherently self limiting to a range of 100 to 500 angstroms. Because the oxidation process is inherently self limiting, consumption of the silicon sidewalls in the active areas is minimized.

Broadly speaking, the present invention contemplates a method for forming an improved isolation trench. A pad layer is formed on a silicon substrate and a silicon nitride layer is then deposited on the pad layer. A photoresist layer is patterned onto the silicon nitride layer with a conventional photolithography process. Exposed regions of the nitride layer and the pad layer situated below the exposed nitride layer are then removed with a wet or dry etch process, whereby regions of the silicon substrate are exposed. Trenches are then etched into the exposed regions of the silicon substrate. Nitrogen is then incorporated into a thin dielectric formed on the sidewalls of the trench. The trench is then filled with a fill dielectric and planarized so that an upper surface of the dielectric is substantially coplanar with an upper surface of the nitride layer.

In one embodiment of the present invention, the nitrogen is incorporated into the structure by forming an oxide on the sidewalls and the trench floor in a nitrogen bearing ambient. The nitrogen bearing ambient, in one embodiment, comprises NO, $N_2O$, or $NH_3$. The oxide can be thermally grown or deposited. In the presently preferred embodiment, the oxide is typically 50–700 angstroms thick.

In another embodiment of the present invention, the step of incorporating the nitrogen into the trench structure comprises implanting the nitrogen into the sidewalls and trench floor. In one embodiment, the nitrogen may be implanted through an oxide layer formed on the sidewalls and the floor. In the presently preferred embodiment, the dielectric is comprised of a CVD oxide formed from a TEOS source and the step of planarizing the dielectric comprises polishing the dielectric with a chemical mechanical polish.

The present invention further contemplates an isolation structure formed in a silicon substrate between laterally displaced active regions. The isolation structure comprises a dielectric having a lower surface 500–5,000 angstroms below and substantially parallel to an upper surface of the silicon substrate. The dielectric isolation structure has sidewalls that are substantially perpendicular to the lower dielectric surface. The lower surface and the sidewalls of the dielectric are bounded by a U-shaped dielectric transition region located between the isolation structure and the active areas. The transition region contains between 0 to 0.5 and 2.0 percent nitrogen. In one embodiment of the invention, the dielectric is comprised of CVD oxide.

BRIEF DESCRIPTION OF THE DRAWINGS

Other objects and advantages of the invention will become apparent upon reading the following detailed description and upon reference to the accompanying drawings.

Figure 1:
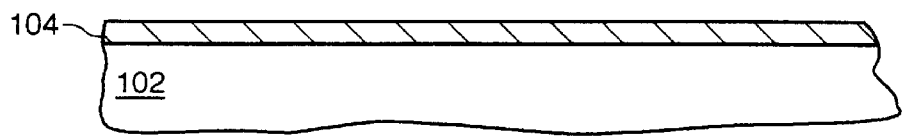
FIG. 1 is a partial cross-sectional view of a semiconductor substrate upon which a pad layer layer has been formed.

While the invention is susceptible to various modifications and alternative forms, specific embodiments thereof are shown by way of example in the drawing and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE DRAWINGS

Figure 6:
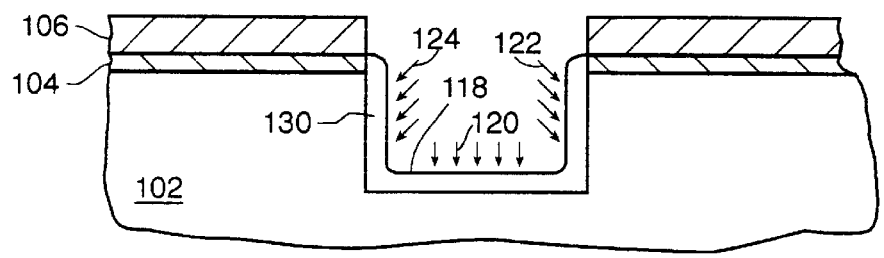
FIG. 6 is a processing step subsequent to FIG. 4, in which nitrogen is implanted into a dielectric layer formed on the sidewalls and floor of the trench.
Figure 7:
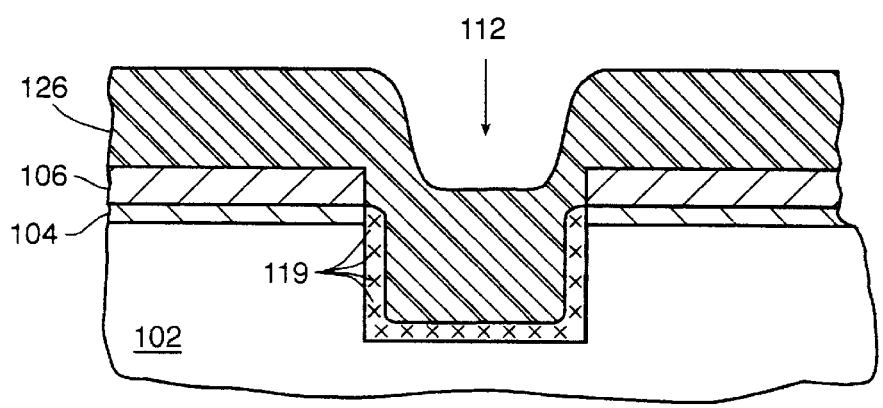
FIG. 7 is a processing step subsequent to FIG. 5 or 6, in which a dielectric has been deposited to fill the trench.
Figure 8:
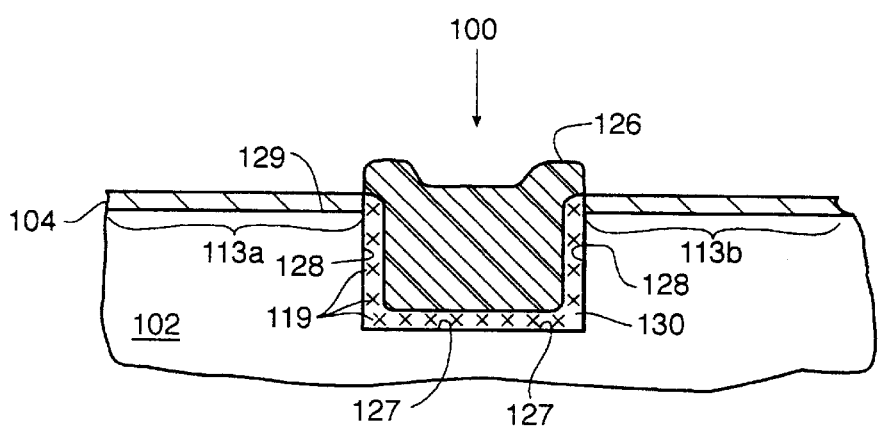
FIG. 8 is a processing step subsequent to FIG. 7, in which the fill dielectric has been planarized and the nitride layer has been stripped.

Turning now to the drawings, FIGS. 1–8 illustrate a process sequence for forming an isolation structure between adjacent active regions within a semiconductor substrate. Referring briefly to FIG. 8, an improved isolation structure 100 is shown therein. Isolation structure 100 is comprised of dielectric 126 having a trench floor 127 and sidewalls 128. Trench floor 127 is 500 to 5,000 angstroms below substrate upper surface 129. Sidewalls 128 are substantially perpendicular to dielectric floor 127. Sidewalls 128 and trench floor 127 are bounded by a nitrogenated transition region 130. In the presently preferred embodiment of isolation structure 100, transition region 130 is 50–700 angstroms thick. Transition region 130 contains approximately 0.5 to 2.0 percent nitrogen.

Turning now to FIG. 1, semiconductor substrate 102 is shown with a dielectric layer 104 formed thereon. In the presently preferred embodiment, dielectric layer 104 comprises a thermal oxide and semiconductor substrate 102 is a silicon substrate. Dielectric layer 104 is believed to be desirable to prevent stress damage to semiconductor substrate 102 when a silicon nitride layer is subsequently deposited thereon. For this reason, dielectric layer 104 is referred as a "pad layer".

Figure 2:
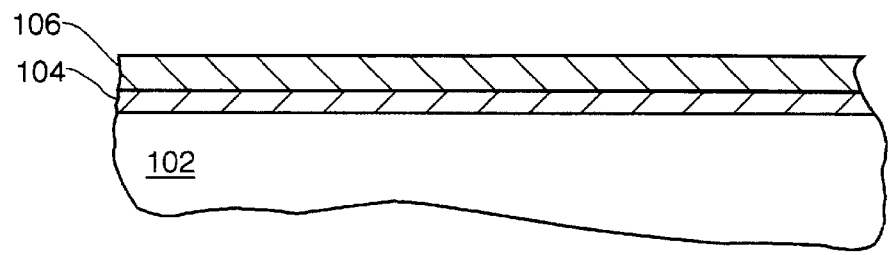
FIG. 2 is a processing step subsequent to FIG. 1, in which a nitride layer has been formed on the pad layer.
Figure 3:
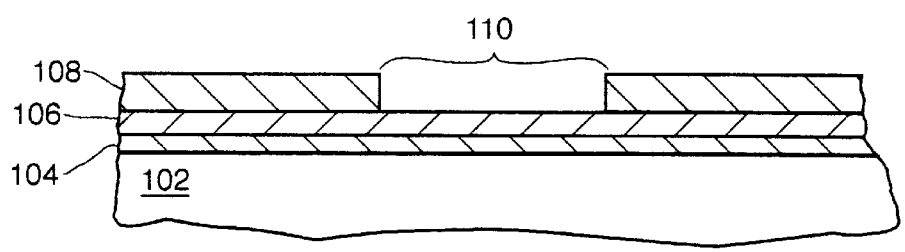
FIG. 3 is a processing step subsequent to FIG. 2, in which a photoresist layer has been patterned on the nitride layer.
Figure 4:
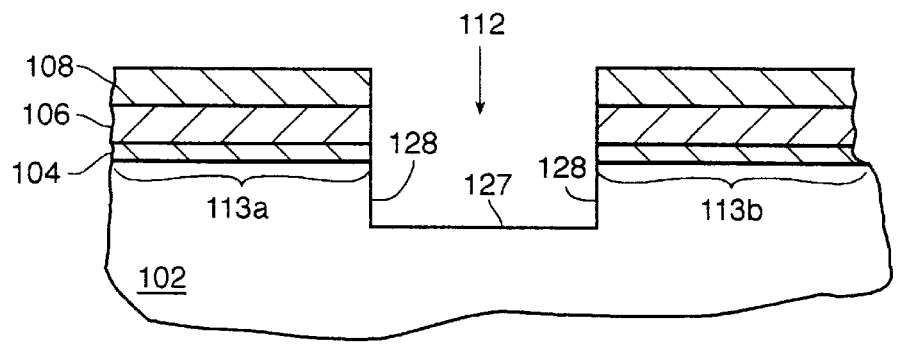
FIG. 4 is a processing step subsequent to FIG. 3, in which a trench has been formed in the semiconductor substrate through the nitride layer and the pad layer.

Turning now to FIG. 2, silicon nitride (nitride) layer 106 is formed on pad layer 104. Formation of nitride layer 106 is preferably accomplished in a low pressure chemical vapor deposition system. As shown in FIG. 3, a patterned photoresist layer 108 is formed on nitride layer 106. Patterning of photoresist layer 108 is accomplished with a photolithography step as is well known in the semiconductor processing field. Photoresist layer 108 is patterned such that window 110 is opened in photoresist layer 108 exposing underlying layer of silicon nitride layer 106. FIG. 4 shows a subsequent processing step in which trench 112 has been etched into semiconductor substrate 102 between first active region 113a and second active region 113b. Trench 112 is preferably formed with a plasma etch process designed to etch nitride layer 106 in lieu of photoresist layer 108 in the regions corresponding to window 110. Plasma etching trench 112 into silicon substrate 102 is believed to create lattice damage in the trench floor 127 and, to a lesser extent, trench sidewalls 128. Lattice damage is believed to be attributable to the bombardment of the substrate by the plasma ions due to the electric field present in a typical parallel plate chamber. In addition, irregularities in trench floor 127 are believed to be traceable to incomplete removal of the silicon nitride layer 106 which can result in regions of the silicon substrate 102 upper surface that etch more slowly than the regions over which nitride was completely removed, thereby resulting in an irregularly shaped trench floor 127. Still further, lattice irregularities are believed to be caused, in part, by plasma ions that penetrate deep into silicon substrate 102 along dislocations within substrate 102. Because the plasma etch process preferably used to form trench 112 creates lattice damage in substrate 102, a large number of dangling bonds are created at sidewalls 128 and floor 127 of trench 112. The dangling bonds can contribute to increased leakage current from first active area 113a to second active area 113b. The dangling bonds can also degrade the reliability of trench isolation structure 100. The dry etch process preferably used to form trench 112 is designed such that trench sidewalls 128 are substantially perpendicular to trench floor 127. Anisotropic etching of silicon nitride, silicon dioxide, and silicon are generally well known. See, e.g., S. Wolf, *Silicon Processing for the VLSI Era*, (Lattice Press 1986), pp. 555–568.

Figure 5:
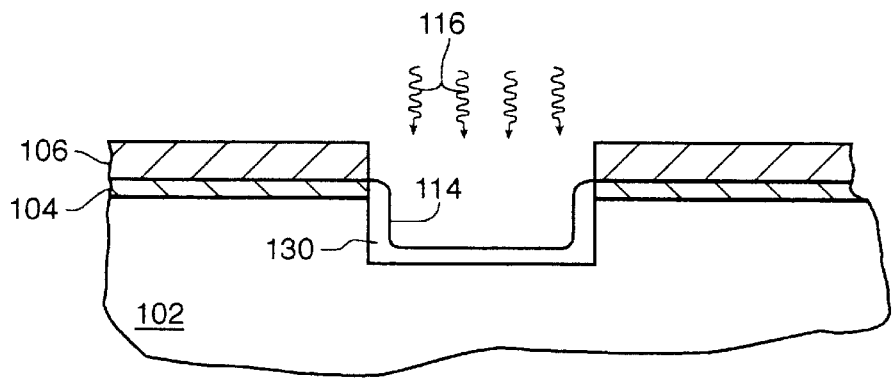
FIG. 5 is a processing step subsequent to FIG. 4, in which a dielectric is formed on the sidewalls and floor of the trench in a nitrogen containing ambient.

Turning now to FIGS. 5 and 6, alternative embodiments are shown for a processing step subsequent to FIG. 4 in which a dielectric, into which nitrogen is incorporated, is formed upon trench sidewalls 128 and trench floor 127. In the embodiment shown in FIG. 5, oxide layer 114 is grown or deposited in a nitrogen containing ambient to form trench liner 130. The nitrogen containing ambient can be comprised of NO, $N_2O$, $NH_3$ or any other nitrogen containing species. In one embodiment, oxide layer 114 comprises a thermal oxide grown in an oxidation tube in which the nitrogen species is present. In another embodiment, oxide layer 114 is deposited in a CVD chamber and thereafter subjected to a rapid thermal anneal (RTA) performed in a nitrogen containing ambient. The nitrogen ambient is represented in the drawing by the arrows 116. Incorporating nitrogen into oxide layer 114 inhibits further growth of oxide layer 114 such that subsequent high temperature processing will not produce a larger grown oxide thickness. Reducing the laterally displaced thickness thereby reduces the amount of encroachment upon active areas 113a and 113b (shown in FIG. 4).

Referring to FIG. 6, an alternative embodiment for incorporating nitrogen into trench liner 130 is shown. In the embodiment shown in FIG. 6, oxide is grown or deposited to form a "pure" oxide layer 118. After the formation of oxide layer 118, a nitrogen species is incorporated into oxide layer 118 through the use of nitrogen implant 120 to form trench liner 130. In the immediately preceding embodiment, nitrogen implant 120 can be accomplished at an angle of 0°, optionally followed by a second implant 122 performed at an angle of 45° and a third implant 124 performed at an angle of –45°. Alternatively, the implants 120, 122, and 124 can be performed prior to the formation of oxide layer 118.

In this embodiment, the implantation is performed directly into sidewall 128 and floor 127 of trench 112. Subsequent formation of oxide layer 118 will serve as an anneal of the lattice damage resulting from the high energy implants.

Figure 9:
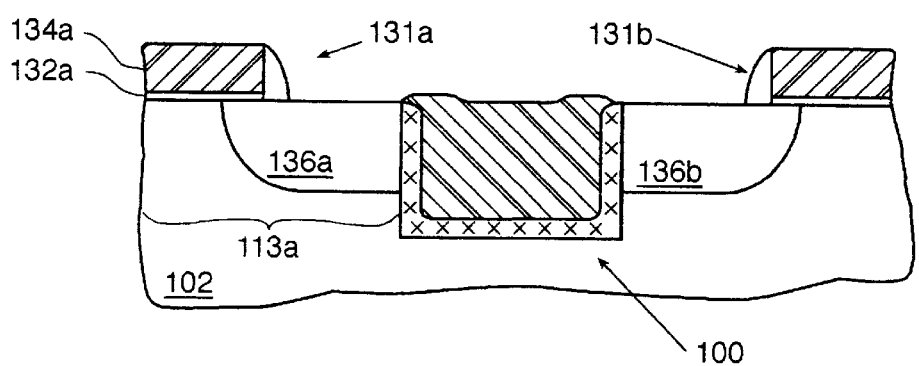
FIG. 9 is a processing step subsequent to FIG. 8, in which transistors have been partially formed in active areas adjacent the isolation trench.

Turning now to FIG. 7, the nitrogen species incorporated into the periphery of trench liner 130 is represented in the drawing by the "X's" 119. FIG. 7 also shows a subsequent processing step in which a fill dielectric 126 has been deposited in trench 112. In the presently preferred embodiment, fill dielectric 126 comprises CVD oxide formed from a TEOS source. FIG. 8 shows a subsequent processing step in which fill dielectric 126 exterior to trench 112 and nitride layer 106 have been removed. In the presently preferred embodiment, the planarization of fill dielectric 126 is accomplished with a chemical mechanical polish while removal of nitride layer 106 is preferably accomplished with a heated solution of phosphoric acid. FIG. 8 shows trench isolation structure 100 formed between laterally displaced active regions 113a and 113b within substrate 102. By incorporating nitrogen into trench liner 130, isolation structure 100 minimizes leakage from first active area 113a to second active area 113b. In addition, the nitrogen provides an excellent barrier against diffusion of sodium, boron, and other contaminants. FIG. 9 shows a subsequent processing step in which first transistor 131a and second transistor 131b have been formed in first active area 113a and second active area 113b respectively. First transistor 131a comprises gate oxide 132a upon polysilicon gate 134a and highly doped source/drain region 136a as is well known in the art.

It will be appreciated to those skilled in the art having the benefit of this disclosure that the invention is capable of applications with numerous types of MOS-processed circuits. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claim be interpreted to embrace all such modifications and changes and, accordingly the specification and drawings are to be regarded in an illustrative rather than a restrictive sense.

What is claimed is:

1. A method for forming an improved isolation trench comprising:

forming a pad layer on a silicon substrate;

depositing a silicon nitride layer on said pad layer;

patterning a photoresist layer on said silicon nitride layer such that regions of said nitride layer are exposed;

removing said exposed regions of said nitride layer and said pad layer situated below said exposed regions of said nitride layer to expose regions of said silicon substrate;

etching trenches into said exposed regions of said silicon substrate, wherein said trenches comprise sidewalls and a trench floor;

implanting nitrogen into said sidewalls and said trench floor;

filling said trench with a dielectric;

planarizing said dielectric such that an upper surface of said dielectric is substantially coplanar with an upper surface of said nitride layer; and removing said nitride layer.

2. The method of claim 1, further comprising forming an oxide on said sidewalls and said floor.

3. The method of claim 2 wherein said oxide is deposited by chemical-vapor deposition.

4. The method of claim 2 wherein said oxide is thermally grown.

5. The method of claim 2 wherein said oxide is 50 to 700 angstroms thick.

6. The method of claim 1 wherein said implanting comprises a first nitrogen implant performed at 0°, a second implant performed at 45°, and a third implant performed at −45°.

7. The method of claim 2 wherein said nitrogen is implanted through said oxide formed on said sidewalls and said floor.

8. The method of claim 1 wherein said dielectric comprises CVD oxide formed from a TEOS source.

9. The method of claim 1 wherein said planarizing said dielectric comprises polishing said dielectric with a chemical mechanical polish.

10. A method for forming an isolation structure between a pair of active regions comprising:

providing a semiconductor substrate having an isolation region interposed between a pair of active regions;

removing an upper region of said semiconductor substrate within said isolation region to form a trench, wherein said trench is bounded by a trench sidewall and a trench floor;

implanting nitrogen into said trench sidewall and said trench floor to form a nitrogenated trench; and filling said nitrogenated trench with a dielectric to form an isolation structure.

11. The method of claim 10, further comprising forming an oxide layer upon said trench sidewall and said trench floor prior to said implanting nitrogen.

12. The method of claim 10, further comprising forming an oxide layer upon said trench sidewall and said trench floor subsequent to said implanting nitrogen.

13. The method of claim 10, wherein said implanting nitrogen comprises performing a first nitrogen implant at 0°, a second implant at 45°, and a third implant at −45°.

* * * * *